United States Patent
Kohno (10) Patent No.: US 11,251,013 B2
(45) Date of Patent: Feb. 15, 2022

(54) DEFLECTOR AND CHARGED PARTICLE BEAM SYSTEM

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 59 days.

(21) Appl. No.: 16/774,648

(22) Filed: Jan. 28, 2020

(65) Prior Publication Data

US 2020/0243297 A1 Jul. 30, 2020

(30) Foreign Application Priority Data

Jan. 29, 2019 (JP) .............................. JP2019-013553

(51) Int. Cl.
*H01J 37/147* (2006.01)
*H01J 37/141* (2006.01)

(52) U.S. Cl.
CPC ........ *H01J 37/1472* (2013.01); *H01J 37/141* (2013.01); *H01J 2237/141* (2013.01)

(58) Field of Classification Search
None
See application file for complete search history.

(56) References Cited

U.S. PATENT DOCUMENTS

| | | | |
|---|---|---|---|
| 2010/0084567 A1* | 4/2010 | Sawada | H01J 37/145 250/396 ML |
| 2016/0225576 A1* | 8/2016 | Kohno | H01J 37/141 |
| 2021/0249218 A1* | 8/2021 | Nakano | H01J 37/153 |

FOREIGN PATENT DOCUMENTS

JP 5218124 A 2/1977
JP 2004234961 A * 8/2004

* cited by examiner

*Primary Examiner* — Michael J Logie
(74) *Attorney, Agent, or Firm* — The Webb Law Firm (57) ABSTRACT

There is provided a deflector that produces only a weak resulting combined hexapole field. The deflector (100) has first to sixth coils (11-16). The first to third coils (11-13) are equal in direction of energization. The fourth to sixth coils (14-16) are equal in direction of energization. The first coil (11) and fourth coil (14) are opposite in direction of energization. The first, third, fourth, and sixth coils (11, 13, 14, 16) are equal in electromotive force. The second coil (12) is equal in electromotive force to the fifth coil (15) and twice the electromotive force of the first coil (11).

10 Claims, 9 Drawing Sheets

FIG.9

DEFLECTOR AND CHARGED PARTICLE BEAM SYSTEM

CROSS REFERENCE TO RELATED APPLICATION

This application claims priority to Japanese Patent Application No. 2019-013553 filed Jan. 29, 2019, the disclosure of which is hereby incorporated by reference in its entirety.

BACKGROUND OF THE INVENTION

1. Field of the Invention

The present invention relates to a deflector and charged particle beam system.

2. Description of the Related Art

In an electron microscope, a deflector or deflector system is used to deflect an electron beam. For example, JP-A-52-18124 discloses a deflector having an annular core around which coils are wound. The coils are electrically energized to produce magnetic fields for deflecting the electron beam.

If the deflector can produce a uniform magnetic field at all times, then the electron beam can be deflected without distorting it. Therefore, in order to produce uniform deflecting magnetic fields, deflectors are so designed that magnetic potentials satisfy certain conditions. One known example of such conditions is that there is a magnetic potential which is symmetric with respect to a first virtual plane and which is antisymmetric with respect to a second virtual plane. The first virtual plane contains both an optical axis and another axis which passes through the optical axis and is parallel to the direction of a deflecting magnetic field. The second virtual plane contains the optical axis and a further axis which passes through the optical axis and is vertical to the direction of the deflecting magnetic field.

In a deflector designed such that the magnetic potential meets the above-described conditions, hexapole fields, decapole fields, and so on are produced in addition to deflecting magnetic fields. Especially, in the vicinity of the optical axis, the effects of the hexapole fields are prominent. If the hexapole fields can be weakened, the electron beam can be deflected without distorting it.

SUMMARY OF THE INVENTION (1) One deflector associated with the present invention has: an annular core; a first coil wound with a width of 30 degrees around the core; a second coil wound with a width of 30 degrees around the core; a third coil wound with a width of 30 degrees around the core; a fourth coil wound with a width of 30 degrees around the core; a fifth coil wound with a width of 30 degrees around the core; and a sixth coil wound with a width of 30 degrees around the core. The first, second, third, fourth, fifth, and sixth coils are arranged in this order and at regular angular intervals such that the angular intervals between successive ones of the first through sixth coils including the interval between the sixth and first coils are equal to each other. The first, second, and third coils are equal in direction of energization. The fourth, fifth, and sixth coils are equal in direction of energization. The first and fourth coils are mutually opposite in direction of energization. The first, third, fourth, and sixth coils are equal in electromotive force. The second and fifth coils are equal in electromotive force. The second coil is twice the electromotive force of the first coil.

In this deflector, the first, third, fourth, and sixth coils form a first coil set which produces a deflecting magnetic field. The second and fifth coils form a second coil set which also produces a deflecting magnetic field. These deflecting magnetic fields are identical in direction. Consequently, a usable, resulting combined deflecting magnetic field can be produced. The hexapole field produced by the first coil set and the hexapole field produced by the second coil set are opposite in polarity and hence these hexapole fields cancel each other. As a result, the resulting combined hexapole field can be weakened.

(2) A charged particle beam system associated with the present invention includes a deflector or deflectors as defined in (1) above.

Because this charged particle beam system includes the above-described deflectors, a charged particle beam can be deflected without distorting it.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

1.1. Configuration of Deflector

Figure 1:
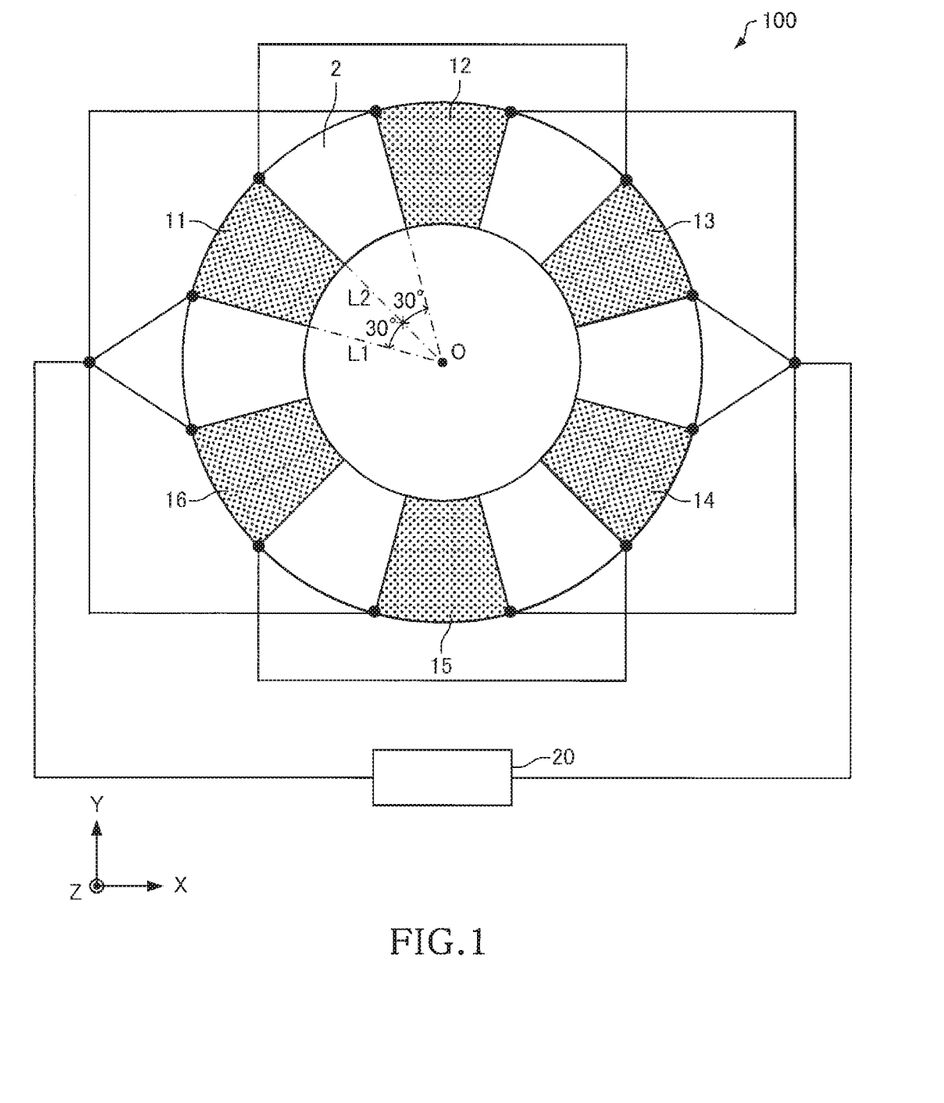
FIG. 1 is a plan view illustrating the configuration of a deflector associated with a first embodiment of the present invention.

The configuration of a deflector associated with a first embodiment is first described by referring to some drawings. FIG. 1 illustrates the configuration of the deflector, 100, associated with the first embodiment. In FIG. 1, X-, Y-, and Z-axes are shown as three mutually perpendicular axes. FIG. 1 is a plan view of the deflector 100 as viewed from the Z-direction. The Z-axis is parallel to the central axis O of a core 2.

The deflector 100 includes the core 2, a first coil 11, a second coil 12, a third coil 13, a fourth coil 14, a fifth coil 15, a sixth coil 16, and a power supply 20. In the deflector 100, the central axis O defines an optical axis. A charged particle beam passing along the optical axis is deflected in the Y direction. Examples of such a charged particle beam include an electron beam and an ion beam.

The core 2 forms a magnetic flux passage. The core 2 is annular in shape and centered at the central axis O. The core 2 is made of a magnetic material and has a circular cross-sectional shape, for example. The core 2 is a toroidal core.

The first coil 11 is wound with a width of 30 degrees around the core 2. In particular, as shown in FIG. 1, one end of the first coil 11 and the central axis O of the core 2 are interconnected by a first straight virtual line L1 as viewed in the X-Y plane. The other end of the first coil 11 and the central axis O of the core 2 are interconnected by a second straight virtual line L2 which makes an angle of 30 degrees with the first straight virtual line L1. In other words, as viewed in the X-Y plane, the outer periphery of the first coil 11 assumes an arcuate form with a center angle of 30 degrees.

The second coil 12 is wound with a width of 30 degrees around the core 2 in the same manner as the first coil 11. Each of the third coil 13, fourth coil 14, fifth coil 15, and sixth coil 16 is wound with a width of 30 degrees around the core 2 in the same manner as the first coil 11.

The first coil 11, second coil 12, third coil 13, fourth coil 14, fifth coil 15, and sixth coil 16 have the same number of turns. Furthermore, the first through sixth coils 11-16 are identical in winding shape and material.

The first coil 11, second coil 12, third coil 13, fourth coil 14, fifth coil 15, and sixth coil 16 are arranged in this order. In the example shown in FIG. 1, the first through sixth coils 11-16 are arranged clockwise in this order.

The first through sixth coils 11, 12, 13, 14, 15, and 16, respectively, are arranged at uniform angular intervals. Specifically, the angular intervals between the first coil 11 and the second coil 12, between the second coil 12 and the third coil 13, between the third coil 13 and the fourth coil 14, between the fourth coil 14 and the fifth coil 15, between the fifth coil 15 and the sixth coil 16, and between the sixth coil 16 and the first coil 11 are all equal to each other and 30 degrees.

The first through sixth coils 11-16 are supplied with electrical current from the power supply 20. In the example shown in FIG. 1, a series combination of the first coil 11 and the third coil 13, a series combination of the fourth coil 14 and the sixth coil 16, and a series combination of the second coil 12 and the fifth coil 15 are connected in parallel to the power supply 20.

The electrical currents flowing through the first coil 11, third coil 13, fourth coil 14, and sixth coil 16, respectively, are all equal in magnitude. The electrical currents flowing through the second coil 12 and fifth coil 15, respectively, are equal in magnitude. The electrical current flowing through the second coil 12 is twice the magnitude of the electrical current flowing through the first coil 11.

By way of example, assuming that the magnitude of the electrical current flowing through the first coil 11 is I amperes, the magnitude of the electrical current flowing through the second coil 12 is 2×I amperes. The magnitude of the electrical current flowing through the third coil 13 is I amperes. The magnitude of the electrical current flowing through the fourth coil 14 is I amperes. The magnitude of the electrical current flowing through the fifth coil 15 is 2×I amperes. The magnitude of the electrical current flowing through the sixth coil 16 is I amperes.

The electromotive force of a coil is determined by the product of the number of turns of the coil and the electrical current flowing through the coil. The electrical currents flowing through the first coil 11, second coil 12, third coil 13, fourth coil 14, fifth coil 15, and sixth coil 16, respectively, have the above-described relationship. Therefore, the first coil 11, third coil 13, fourth coil 14, and sixth coil 16 are equal in electromotive force. Furthermore, the second coil 12 and fifth coil 15 are equal in electromotive force. The second coil 12 is twice the electromotive force of the first coil 11.

By way of example, assuming that the electromotive force of the first coil 11 is F amperes, the electromotive force of the second coil 12 is 2×F amperes. The electromotive force of the third coil 13 is F amperes. The electromotive force of the fourth coil 14 is F amperes. The electromotive force of the fifth coil 15 is 2×F amperes. The electromotive force of the sixth coil 16 is F amperes.

Figure 2:
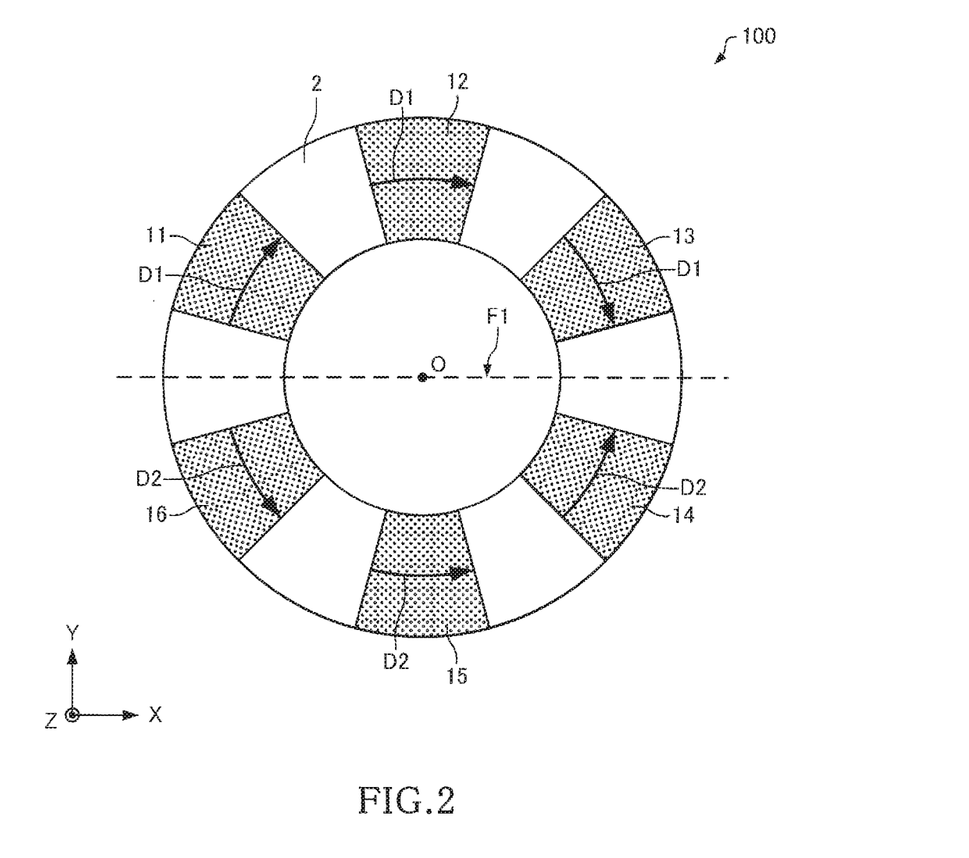
FIG. 2 is a plan view illustrating the directions of energization of the coils in the deflector of FIG. 1.

FIG. 2 illustrates the directions of energization of the individual coils. The direction of energization of a coil referred to herein is the direction of lines of magnetic force generated by the coil within it. The direction of energization of the coil is determined by the sense of winding of the coil and the sense of the electrical current flowing through the coil.

The first coil 11 can assume any one of two directions as its direction of energization. In particular, the direction of energization of the first coil 11 can assume any one of two directions: a clockwise direction along the outer periphery of the core 2 and a counterclockwise direction along the outer periphery of the core 2. Each of the second coil 12, third coil 13, fourth coil 14, fifth coil 15, and sixth coil 16 can similarly assume any one of the two directions as its direction of energization.

In the deflector 100, the first coil 11, second coil 12, and third coil 13 have the same direction of energization. Also, the fourth coil 14, fifth coil 15, and sixth coil 16 have the same direction of energization. The first coil 11 and fourth coil 14 are mutually opposite in direction of energization.

The direction of energization of the first coil 11 is a first direction D1. In the example shown in FIG. 2, the first direction D1 is a clockwise direction along the outer periphery of the core 2. The direction of energization of the second coil 12 and the direction of energization of the third coil 13 are the first direction D1 in the same way as for the first coil 11.

The direction of energization of the fourth coil 14 is in a second direction D2 which is opposite to the first direction D1. In the example shown in FIG. 2, the second direction D2 is a counterclockwise direction along the outer periphery of the core 2. The direction of energization of the fifth coil 15 and the direction of energization of the sixth coil 16 are in the second direction D2 in the same way as for the fourth coil 14. Alternatively, the first direction D1 and the second direction D2 may be a counterclockwise direction and a clockwise direction, respectively, in a manner not illustrated.

In this way, a first set of coils (first coil 11, second coil 12, and third coil 13) and a second set of coils (fourth coil 14, fifth coil 15, and sixth coil 16) are energized symmetrically with respect to a first virtual plane F1, which includes both the central axis O and an axis passing through the central axis O and parallel to the X-axis. The X-axis is parallel to the direction of the deflecting magnetic field produced by the deflector 100.

As shown in FIG. 1, the power supply 20 supplies electrical current to the first through sixth coils 11-16. The power supply 20 is a DC power supply.

1.2. Operation

Figure 3:
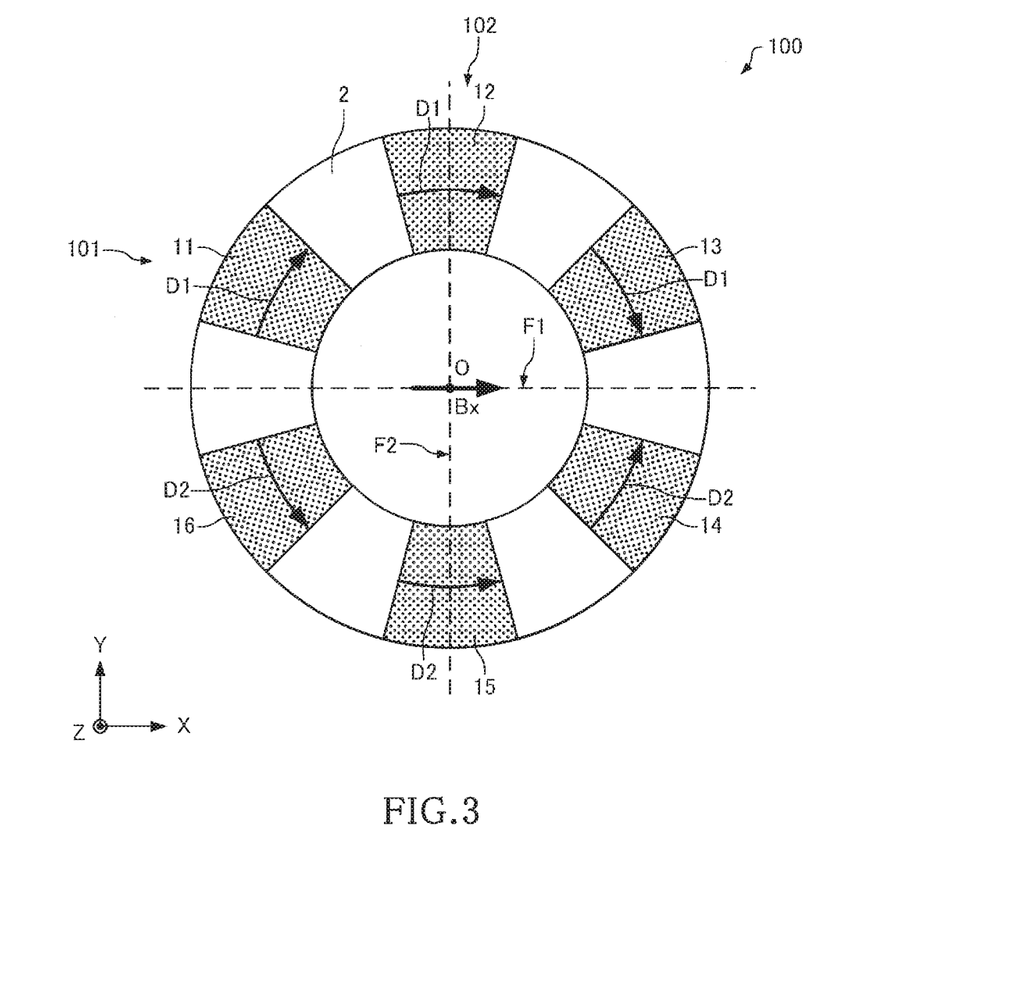
FIG. 3 is a plan view similar to FIG. 2, illustrating the operation of the deflector.

The operation of the deflector 100 is next described by referring to FIG. 3, which illustrates the operation of the deflector 100.

The power supply 20 provides electrical current to the first coil 11, second coil 12, third coil 13, fourth coil 14, fifth coil 15, and sixth coil 16. Consequently, in the deflector 100, there exists a magnetic potential which is symmetric with respect to the first virtual plane F1 and antisymmetric with respect to a second virtual plane F2 that contains both the central axis O and an axis passing through the central axis O and parallel to the Y-axis. That is, the second virtual plane F2 is vertical to the direction of the deflecting magnetic field, Bx.

Because of the production of the magnetic potential, the first coil set 101 consisting of the first coil 11, third coil 13, fourth coil 14, and sixth coil 16 produces an X-directional deflecting magnetic field and a hexapole field. A second coil set 102 consisting of the second coil 12 and fifth coil 15 also produces an X-directional deflecting magnetic field and a hexapole field.

The deflecting magnetic field generated by the first coil set 101 is identical in direction to the deflecting magnetic field generated by the second coil set 102. Accordingly, the deflector 100 can produce a usable X-directional deflecting magnetic field. On the other hand, the hexapole field generated by the first coil set 101 is opposite in polarity to the hexapole field generated by the second coil set 102 and so these hexapole fields cancel each other.

Consequently, in the deflector 100, a weakened resulting composite hexapole field can be produced.

1.3. Features

The deflector 100 has the following features. In the deflector 100, the first coil 11, the second coil 12, and third coil 13 are identical in direction of energization. The fourth coil 14, fifth coil 15, and sixth coil 16 are identical in direction of energization. The first coil 11 and fourth coil 14 are mutually opposite in direction of energization. The first coil 11, third coil 13, fourth coil 14, and sixth coil 16 are identical in electromotive force. The second coil 12 and fifth coil 15 are identical in electromotive force. The second coil 12 is twice the electromotive force of the first coil 11.

Therefore, in the deflector 100, the deflecting magnetic fields respectively produced by the first coil set 101 and the second coil set 102 are identical in direction. Consequently, a usable resulting combined deflecting magnetic field can be produced. Furthermore, in the deflector 100, the hexapole fields respectively produced by the first coil set 101 and the second coil set 102 are opposite in polarity and cancel each other. As a result, in the deflector 100, a weakened resulting combined hexapole field can be generated. Hence, in the deflector 100, a charged particle beam such as an electron beam or an ion beam can be deflected without distorting it.

The deflector 100 is a toroidal coil having the annular core 2 around which coils are wound. Therefore, the deflector can be made smaller in size, for example, than where a horse-shoe-type coil or coils are used.

In the deflector 100, the first coil 11, second coil 12, third coil 13, fourth coil 14, fifth coil 15, and sixth coil 16 are equal in number of turns. Furthermore, the electrical currents flowing through the first coil 11, third coil 13, fourth coil 14, and sixth coil 16, respectively, are equal in magnitude. The electrical currents flowing through the second coil 12 and fifth coil 15 are equal in magnitude. The electrical current flowing through the second coil 12 is twice the magnitude of the electrical current flowing through the first coil 11. Consequently, in the deflector 100, the above-described magnetic potential can be produced without varying the number of turns of the first to sixth coils 11-16.

2. Second Embodiment

Figure 4:
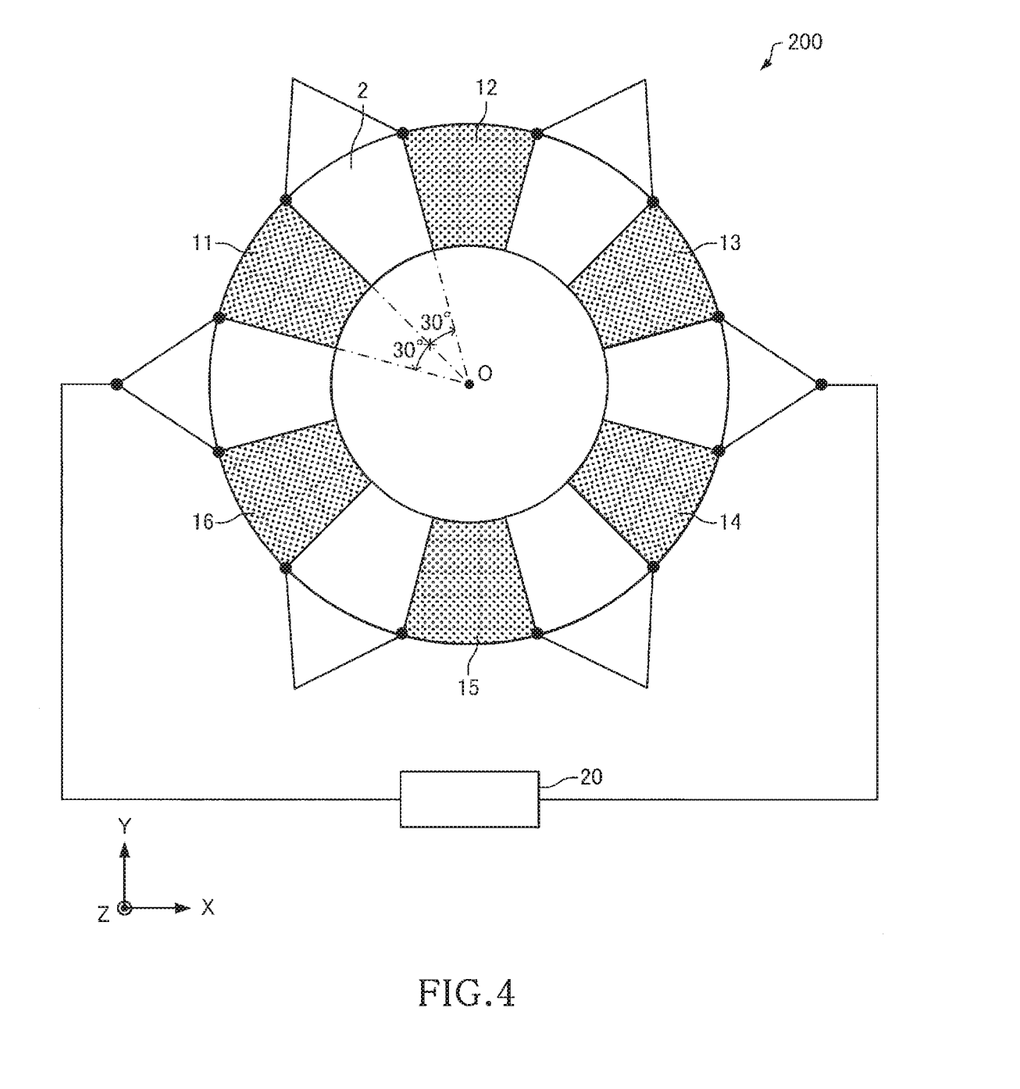
FIG. 4 is a plan view illustrating the configuration of a deflector associated with a second embodiment.

A deflector associated with a second embodiment is next described by referring to FIG. 4, which illustrates the configuration of the deflector, 200, associated with the second embodiment. Those components or members of the deflector 200 which are similar in function to their counterparts of the deflector 100 associated with the first embodiment are indicated by the same reference numerals as in the above cited figures and a detailed description thereof is omitted.

In the above-described deflector 100, the electromotive forces of the coils are adjusted by adjusting the electrical currents flowing through the coils. On the other hand, in the deflector 200, the electromotive forces of the coils are controlled by adjusting the numbers of turns of the coils.

Specifically, in the deflector 200, the first coil 11, third coil 13, fourth coil 14, and sixth coil 16 are identical in number of turns. Furthermore, the second coil 12 and fifth coil 15 are equal in number of turns. The second coil 12 is twice the number of turns of the first coil 11. That is, let N be the number of turns of the first coil 11, the number of turns of the second coil 12 is 2×N, the number of turns of the third coil 13 is N, the number of turns of the fourth coil 14 is N, the number of turns of the fifth coil 15 is 2×N, and the number of turns of the sixth coil 16 is N.

In the deflector 200, the electrical currents flowing through the first through sixth coils 11-16, respectively, are equal in magnitude. As shown in FIG. 4, a series combination of the first coil 11, second coil 12, and third coil 13 and a series combination of the fourth coil 14, fifth coil 15, and sixth coil 16 are connected in parallel with the power supply 20.

In the deflector 200, a magnetic potential similar to that in the deflector 100 can be produced. Accordingly, in the deflector 200, a reduced resulting combined hexapole field can be developed in the same manner as in the deflector 100. Furthermore, in the deflector 200, the electrical currents flowing through the first through sixth coils 11-16, respectively, can be made identical in magnitude.

3. Third Embodiment

Figure 5:
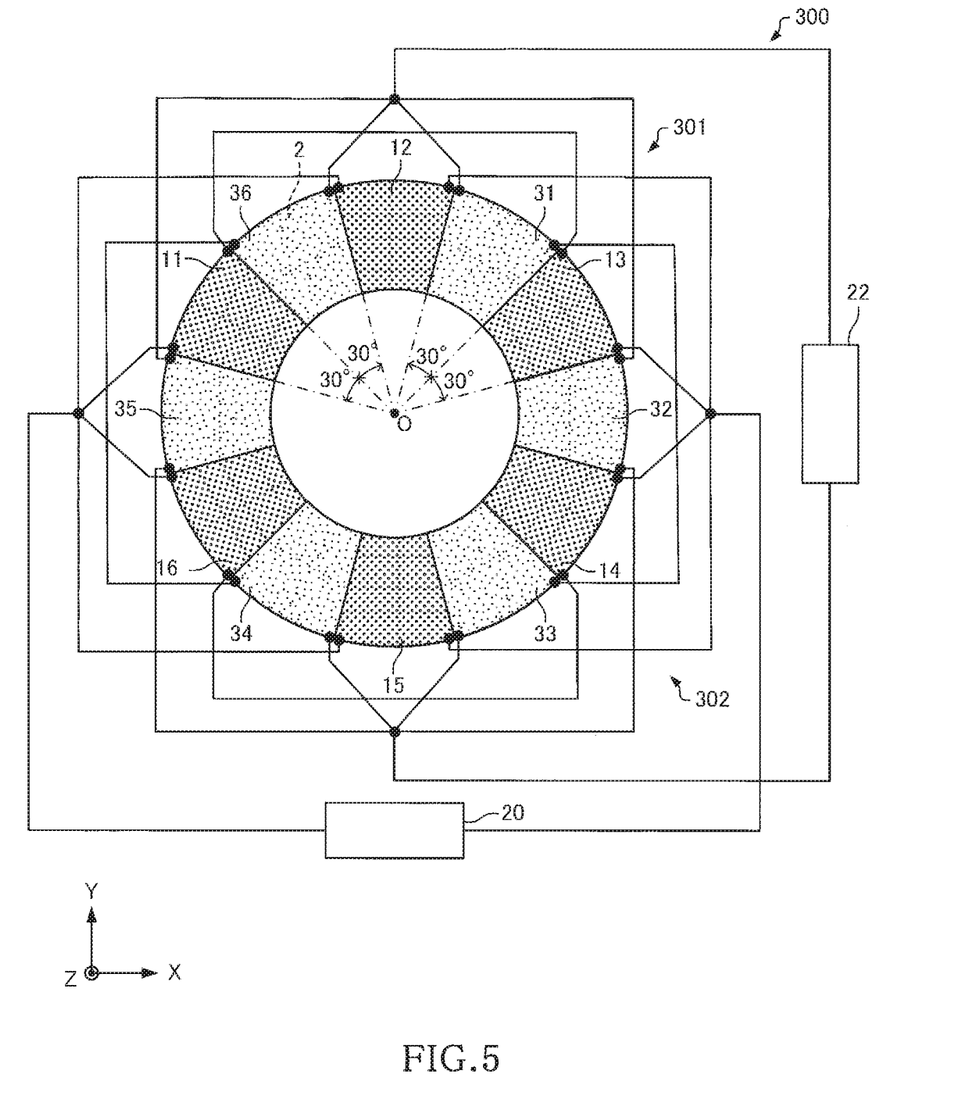
FIG. 5 is a plan view illustrating the configuration of a deflector associated with a third embodiment.

A deflector associated with a third embodiment is next described by referring to FIG. 5 which illustrates the configuration of the deflector, 300, associated with the third embodiment. Those components or members of the deflector 300 which are similar in function to their counterparts of the deflector 100 associated with the first embodiment are hereinafter indicated by the same reference numerals as in the above referenced figures and a detailed description thereof is omitted.

In the above-described deflector 100, six coils are arranged around the core 2 to produce an X-directional deflecting magnetic field. On the other hand, in the deflector 300, two sets of coils, each set consisting of 6 coils, are arranged around the core 2 to produce an X-directional deflecting magnetic field and a Y-directional deflecting magnetic field.

As shown in FIG. 5, the deflector 300 includes a core 2, a first coil 11, a second coil 12, a third coil 13, a fourth coil 14, a fifth coil 15, a sixth coil 16, a first power supply 20, a seventh coil 31, an eighth coil 32, a ninth coil 33, a tenth coil 34, an eleventh coil 35, a twelfth coil 36, and a second power supply 22.

In the deflector 300, the first through sixth coils 11-16, respectively, together constitute a first coil set 301. The seventh through twelfth coils 31-36, respectively, together constitute a second coil set 302. The first coil set 301 produces an X-directional deflecting magnetic field. The second coil set 302 produces a Y-directional deflecting magnetic field. The second coil set 302 is rotationally shifted by 90 degrees relative to the first coil set 301 about the central axis O.

The first coil 11, second coil 12, third coil 13, fourth coil 14, fifth coil 15, and sixth coil 16 are similar in configuration with their counterparts of the above-described deflector 100.

The seventh coil 31 is wound with a width of 30 degrees around the core 2. Each of the eighth through twelfth coils 32-36 is wound with a width of 30 degrees around the core 2 in the same way as the seventh coil 31.

The seventh coil 31, eighth coil 32, ninth coil 33, tenth coil 34, eleventh coil 35, and twelfth coil 36 are equal in number of turns. Also, the seventh through twelfth coils 31-36 are identical in winding shape and material.

In the deflector 300, the first coil 11, twelfth coil 36, second coil 12, seventh coil 31, third coil 13, eighth coil 32, fourth coil 14, ninth coil 33, fifth coil 15, tenth coil 34, sixth coil 16, and eleventh coil 35 are arranged in this order. In the example shown in FIG. 2, the first coil 11, twelfth coil 36, second coil 12, seventh coil 31, third coil 13, eighth coil 32, fourth coil 14, ninth coil 33, fifth coil 15, tenth coil 34, sixth coil 16, and eleventh coil 35 are arranged clockwise in this order.

The seventh through twelfth coils 31-36, respectively, are angularly equally spaced from each other. That is, the angular intervals between the seventh coil 31 and the eighth coil 32, between the eight coil 32 and the ninth coil 33, between the ninth coil 33 and the tenth coil 34, between the tenth coil 34 and the eleventh coil 35, between the eleventh coil 35 and the twelfth coil 36, and between the twelfth coil 36 and the seventh coil 31 are all equal to each other. The angular interval between the seventh coil 31 and the eighth coil 32 is 30 degrees.

The first coil 11, second coil 12, third coil 13, fourth coil 14, fifth coil 15, sixth coil 16, seventh coil 31, eighth coil 32, ninth coil 33, tenth coil 34, eleventh coil 35, and twelfth coil 36 do not overlap each other. For example, the angular interval between the first coil 11 and the second coil 12 is 30 degrees. The twelfth coil 36 having a width or angular extent of 30 degrees is positioned between these first coil 11 and second coil 12 without overlaps.

Similarly, the seventh coil 31 positioned between the second coil 12 and third coil 13 overlaps neither the second coil 12 nor the third coil 13. Also, the eighth coil 32 arranged between the third coil 13 and fourth coil 14 overlaps neither the third coil 13 nor the fourth coil 14. The ninth coil 33 located between the fourth coil 14 and fifth coil 15 overlaps neither the fourth coil 14 nor the fifth coil 15. The tenth coil 34 placed between the fifth coil 15 and sixth coil 16 overlaps neither the fifth coil 15 nor the sixth coil 16. The eleventh coil 35 positioned between the sixth coil 16 and first coil 11 overlaps neither the sixth coil 16 nor the first coil 11. The twelfth coil 36 positioned between the first coil 11 and second coil 12 overlaps neither the first coil 11 nor the second coil 12.

The seventh through twelfth coils 31-36, respectively, are supplied with electrical current from the second power supply 22. A series combination of the seventh coil 31 and the ninth coil 33, a series combination of the tenth coil 34 and the twelfth coil 36, and a series combination of the eighth coil 32 and the eleventh coil 35 are connected in parallel with the second power supply 22.

The electrical currents flowing through the seventh coil 31, ninth coil 33, tenth coil 34, and twelfth coil 36, respectively, are equal in magnitude. Also, the electrical currents flowing through the eighth coil 32 and eleventh coil 35, respectively, are equal in magnitude. The electrical current flowing through the eighth coil 32 is twice the magnitude of the electrical current flowing through the seventh coil 31.

Because the electrical currents flowing through the seventh through twelfth coils 31-36, respectively, have the above-described relationship, the seventh through twelfth coils 31-36 are equal in electromotive force. Also, the eighth coil 32 and eleventh coil 35 are equal in electromotive force. The electromotive force of the eighth coil 32 is twice that of the seventh coil 31.

Figure 6:
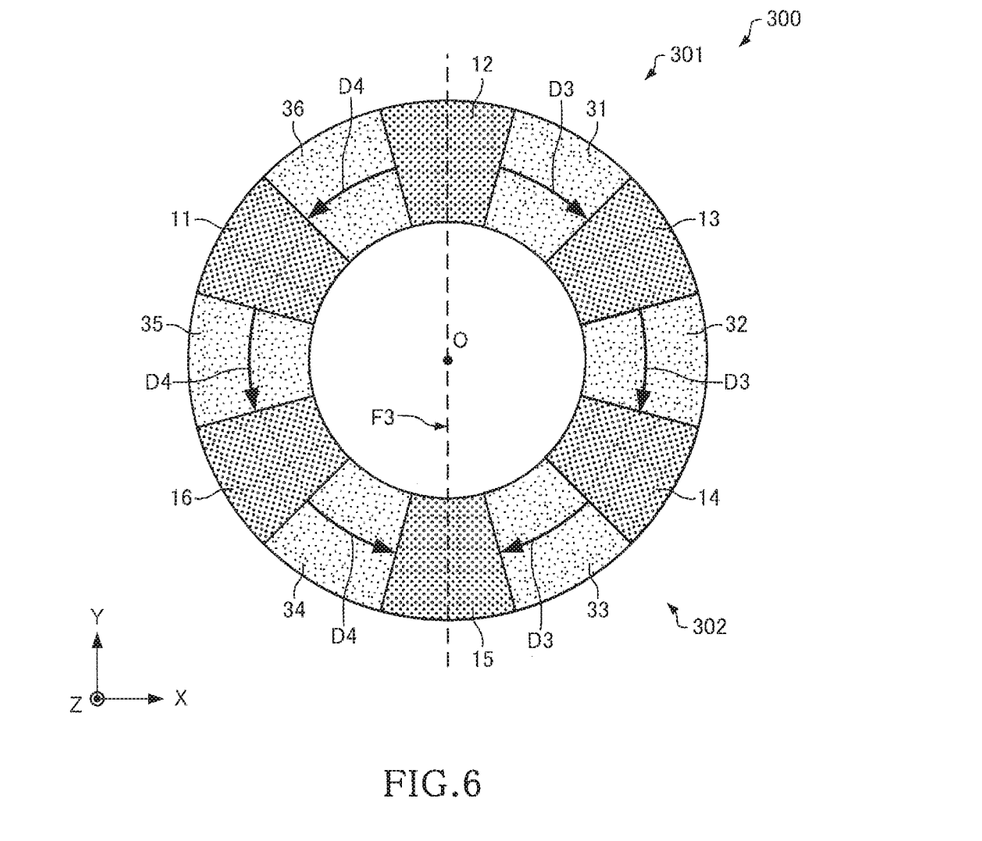
FIG. 6 is a plan view illustrating the directions of energization of a second coil set of the deflector of FIG. 5.

FIG. 6 illustrates the directions of energization of the second coil set 302. In the deflector 300, the seventh coil 31, eighth coil 32, and ninth coil 33 have the same direction of energization. Also, the tenth coil 34, eleventh coil 35, and twelfth coil 36 have the same direction of energization. However, the seventh coil 31 and tenth coil 34 are mutually opposite in direction of energization.

The direction of energization of the seventh coil 31 lies in a third direction D3. In the example shown in FIG. 6, the third direction D3 is a clockwise direction along the outer periphery of the core 2. The direction of energization of the eighth coil 32 and the direction of energization of the ninth coil 33 lie in the third direction D3 in the same way as for the seventh coil 31.

The direction of energization of the tenth coil 34 lies in a fourth direction D4, which is opposite to the third direction D3. In the example shown in FIG. 6, the fourth direction D4 is a counterclockwise direction along the outer periphery of the core 2. The direction of energization of the eleventh coil 35 and the direction of energization of the twelfth coil 36 lie in the fourth direction D4 in the same manner as for the tenth coil 34. Alternatively, the third direction D3 and the fourth direction D4 may be a counterclockwise direction and a clockwise direction, respectively, in a manner not illustrated.

In this way, the seventh coil 31, eighth coil 32, ninth coil 33, the tenth coil 34, eleventh coil 35, and twelfth coil 36 are energized symmetrically with respect to a third virtual plane F3 which contains both the central axis O and an axis passing through the central axis O and parallel to the Y-axis. The Y-axis is parallel to the direction of the deflecting magnetic field produced by the second coil set 302 of the deflector 300.

The second power supply 22 supplies electrical current to the seventh through twelfth coils 31-36. The second power supply 22 is a DC power supply.

3.2. Operation

Figure 7:
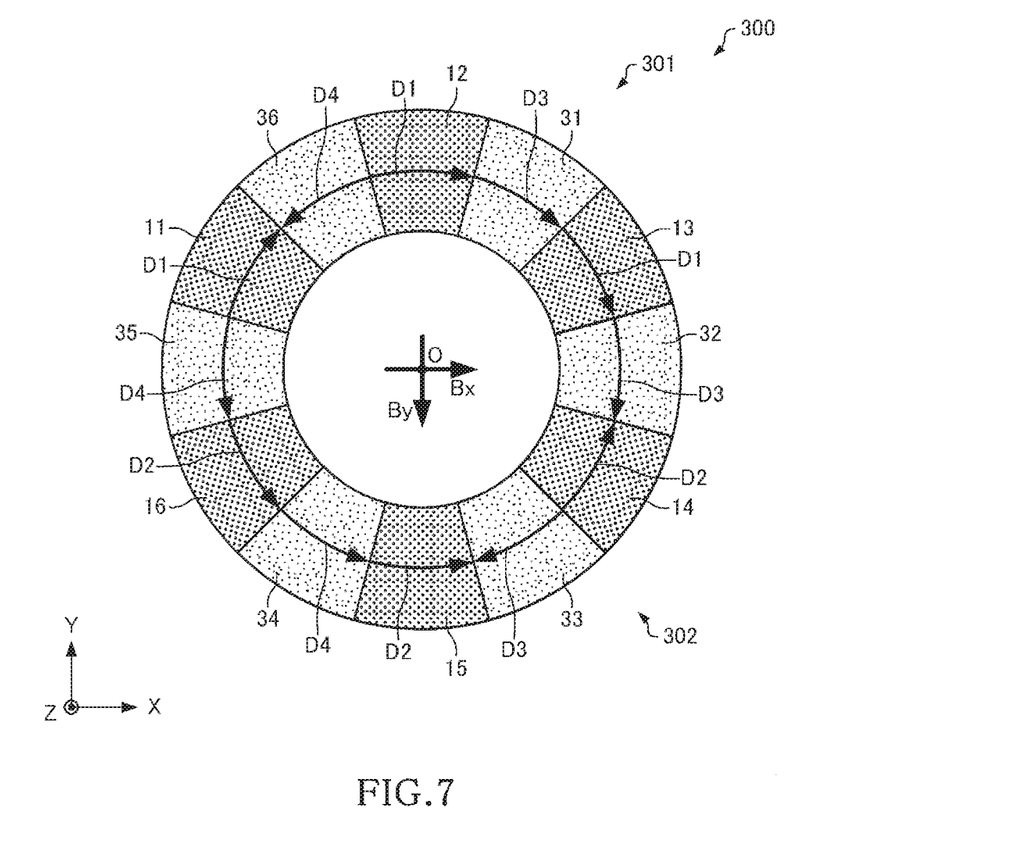
FIG. 7 is a plan view illustrating the operation of the deflector of FIG. 5.

The operation of the deflector 300 is next described by referring to FIG. 7, which illustrates the operation of the deflector 300.

The first power supply 20 supplies electrical current to the first through sixth coils 11-16. Consequently, the first coil set 301 made of these coils 11-16 produces an X-directional deflecting magnetic field Bx as described above in "1.3. Operation".

The second power supply 22 supplies electrical current to the seventh through twelfth coils 31-36. As a result, these six coils 31-36 produce a magnetic potential that is rotationally shifted by 90 degrees relative to the magnetic potential in the deflector 100. Therefore, the second coil set 302 produces a Y-directional deflecting magnetic field By. At this time, the seventh coil 31, ninth coil 33, tenth coil 34, and twelfth coil 36 together produce a hexapole field that is opposite in polarity to the hexapole field produced by the combination of the eighth coil 32 and eleventh coil 35. Hence, these two hexapole fields cancel each other. As a result, a weakened resulting combined hexapole field can be generated.

As described previously, in the deflector 300, the X-directional deflecting magnetic field Bx and the Y-directional deflecting magnetic field By can be generated by means of the first coil set 301 and second coil set 302.

3.3. Features

The deflector 300 has the following features. In the deflector 300, the seventh coil 31, eighth coil 32, and ninth coil 33 are identical in direction of energization. The tenth coil 34, eleventh coil 35, and twelfth coil 36 are identical in direction of energization. The seventh coil 31 and tenth coil 34 are opposite in direction of energization. The seventh coil 31, ninth coil 33, tenth coil 34, and twelfth coil 36 are equal in electromotive force. The eighth coil 32 and eleventh coil 35 are equal in electromotive force. The electromotive force of the eighth coil 32 is twice that of the seventh coil 31.

Therefore, in the deflector 300, the direction of the deflecting magnetic field produced by a set consisting of the seventh coil 31, ninth coil 33, tenth coil 34, and twelfth coil 36 is the same as the direction of the deflecting magnetic field produced by a set consisting of the eighth coil 32 and eleventh coil 35. Consequently, a useful, resulting composite Y-directional deflecting magnetic field can be set up. Furthermore, in the deflector 300, the hexapole field produced by the set of the seventh coil 31, ninth coil 33, tenth coil 34, and twelfth coil 36 is opposite in polarity to the hexapole field produced by the set of the eighth coil 32 and eleventh coil 35 and thus these two hexapole fields cancel each other. As a result, in the deflector 300, only a weak resulting composite hexapole field is generated. Thus, in the deflector 300, a charged particle beam such as an electron beam or an ion beam can be deflected without distortion in the X- and Y-directions.

Furthermore, in the deflector 300, the first coil 11, second coil 12, third coil 13, fourth coil 14, fifth coil 15, sixth coil 16, seventh coil 31, eighth coil 32, ninth coil 33, tenth coil 34, eleventh coil 35, and twelfth coil 36 do not overlap each other and so the deflector 300 is easy to manufacture. Additionally, in the deflector 300, coil end portions do not overlap the winding portions and, therefore, the coil end portions can be treated easily.

In the deflector 300, the first coil set 301 for producing the X-directional deflecting magnetic field and the second coil set 302 for producing the Y-directional deflecting magnetic field can be configured similarly except for their different senses. Therefore, in the deflector 300, deflecting magnetic fields of the same strength can be produced, for example, by making equal the magnitudes of the electrical currents flowing through the first coil set 301 and the second coil set 302, respectively. In consequence, in the deflector 300, the deflecting magnetic fields can be controlled easily.

4. Fourth Embodiment

Figure 8:
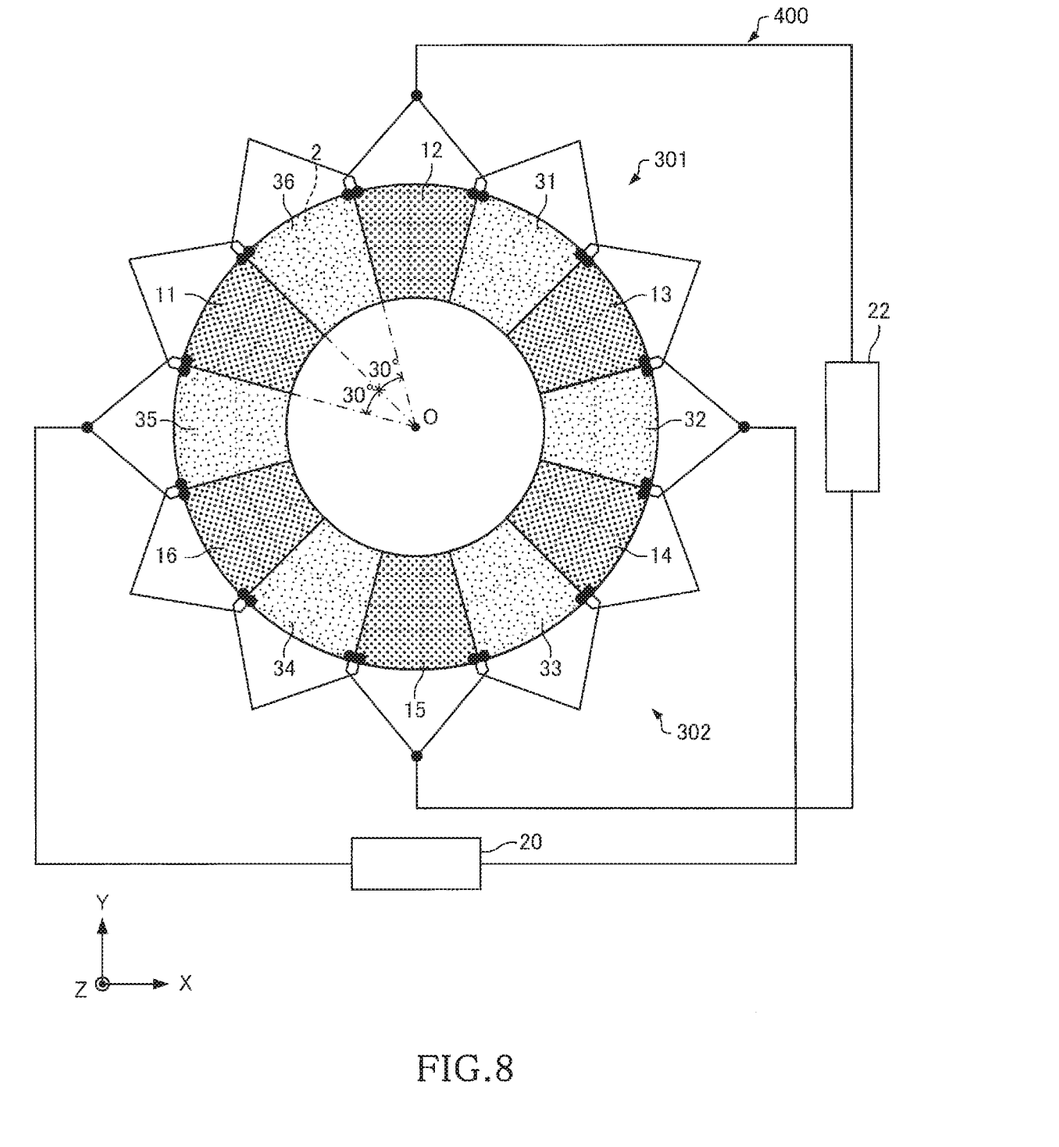
FIG. 8 is a plan view illustrating the configuration of a deflector associated with a fourth embodiment.

A deflector associated with a fourth embodiment is next described by referring to FIG. 8, which shows the configuration of the deflector, 400, associated with the fourth embodiment. Those members or components of the deflector 400 which are similar in function to their respective counterparts of the deflector 100 associated with the first embodiment, the deflector 200 associated with the second embodiment, and the deflector 300 associated with the third embodiment are indicated by the same reference numerals as in the above referenced figures and a detailed description thereof is omitted.

In the above-described deflector 300, as shown in FIG. 5, the first coil set 301 produces the X-directional deflecting magnetic field, while the second coil set 302 produces the Y-directional deflecting magnetic field. In the first coil set 301 and second coil set 302, the electromotive forces of the individual coils are controlled by adjusting the electrical currents flowing through the coils.

On the other hand, in the deflector 400, the electromotive forces of the individual coils of the first coil set 301 and second coil set 302 are controlled by adjusting the numbers of turns of the coils.

The first through sixth coils 11-16, respectively, are similar in configuration to their counterparts of the deflector 200. The seventh coil 31, ninth coil 33, tenth coil 34, and twelfth coil 36 are equal in number of turns. Also, the eighth coil 32 and eleventh coil 35 are equal in number of turns. The eighth coil 32 has twice the number of turns as the seventh coil 31. The electrical currents flowing through the seventh through twelfth coils 31-36, respectively, are equal in magnitude.

In the deflector 400, a series combination of the seventh coil 31, eighth coil 32, and ninth coil 33 and a series combination of the tenth coil 34, eleventh coil 35, and twelfth coil 36 are connected in parallel with the second power supply 22. The deflector 400 yields advantageous effects similar to those produced by the above-described deflectors 200 and 300.

5. Fifth Embodiment

A charged particle beam system associated with a fifth embodiment is next described. In the following, the charged particle beam system associated with the fifth embodiment is a transmission electron microscope.

Figure 9:
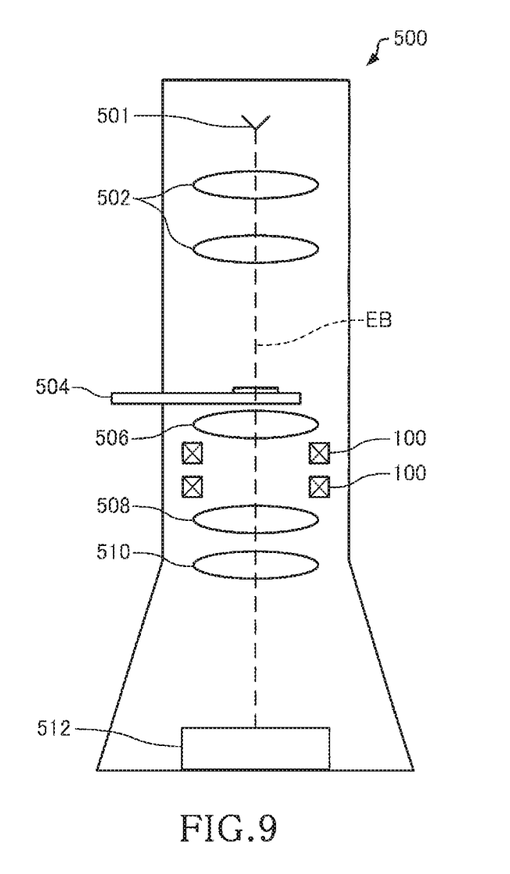
FIG. 9 is a diagram of a charged particle beam system associated with a fifth embodiment.

FIG. 9 illustrates the configuration of the charged particle beam system, 500, associated with the fifth embodiment. As shown in FIG. 9, the charged particle beam system 500 includes deflectors 100 of the same construction as the above-described deflector 100. Alternatively, the charged particle beam system 500 may include deflectors of the same construction as the deflector 200, the deflector 300, or the deflector 400 described above.

As shown in FIG. 9, the charged particle beam system 500 includes an electron gun 501, an illumination lens system 502, a sample stage 504, an objective lens 506, an intermediate lens 508, a projector lens 510, and an imager 512.

The electron gun 501 emits an electron beam EB. The illumination lens system 502 converges the electron beam EB and directs it toward a sample.

The sample stage 504 holds the sample and has moving mechanisms for moving the sample horizontally and vertically. Furthermore, the sample stage 504 has a tilt mechanism for tilting the sample. The field of view of the TEM (transmission electron microscope) image can be moved by moving the sample by means of the sample stage 504.

The electron beam transmitted through the sample is brought to a focus by the objective lens 506 to form the TEM image. The image formed by the objective lens 506 is projected onto the imager 512 through the intermediate lens 508 and projector lens 510.

The imager 512 captures TEM images. Examples of the imager 512 may include a CCD (charge coupled device) camera and a CMOS (complementary metal-oxide-semiconductor) camera.

The deflectors 100 are disposed between the objective lens 506 and the intermediate lens 508. In the illustrated example, there are two deflectors 100 arranged. The deflectors 100 are used to move the field of view of the TEM image by deflecting the electron beam EB transmitted through the sample. Consequently, the field of view can be moved without moving the sample using the sample stage 504. In this way, in the charged particle beam system 500, the deflectors 100 are used as image shifting deflectors.

As described previously, each deflector 100 can reduce the resulting composite hexapole field and so the deflectors 100 can deflect the electron beam EB without distorting it. Therefore, in the charged particle beam system 500, by deflecting the electron beam EB by the use of the deflectors 100, image distortion can be suppressed if the field of view of the TEM image is moved.

The deflectors 100 can be reduced in size as noted above and, therefore, they can be positioned in a narrow space between the objective lens 506 and the intermediate lens 508.

In the foregoing description of the charged particle beam system 500, the deflectors 100 are used as image shifting deflectors. The deflectors 100 may also be used for other applications.

Furthermore, in the foregoing description, the deflectors 100 are applied to a transmission electron microscope. The deflectors 100 can also be applied to other charged particle beam systems such as scanning electron microscope, scanning transmission electron microscope, focused ion beam system, electron probe microanalyzer, Auger microprobe, and electron beam lithography system.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A charged particle beam deflector comprising:
   an annular core;
   a first coil wound with a width of 30 degrees around the core;
   a second coil wound with a width of 30 degrees around the core;
   a third coil wound with a width of 30 degrees around the core;
   a fourth coil wound with a width of 30 degrees around the core;
   a fifth coil wound with a width of 30 degrees around the core;
   a sixth coil wound with a width of 30 degrees around the core; and
   a first power supply electrically connected to the first coil, the second coil, the third coil, the fourth coil, the fifth coil and the sixth coil,
   wherein the first coil, the second coil, the third coil, the fourth coil, the fifth coil, and the sixth coil are arranged from first through sixth and at regular angular intervals such that the angular intervals between successive ones of the first through sixth coils including the interval between the sixth and first coils are equal to each other,
   wherein the first, second, and third coils are equal in direction of energization when supplied with electrical current from the first power supply,
   wherein the fourth, fifth, and sixth coils are equal in direction of energization when supplied with electrical current from the first power supply,
   wherein the first and fourth coils are mutually opposite in direction of energization when supplied with electrical current from the first power supply,
   wherein the first, third, fourth, and sixth coils are equal in electromotive force when supplied with electrical current from the first power supply,
   wherein the second and fifth coils are equal in electromotive force when supplied with electrical current from the first power supply,
   wherein the second coil is twice the electromotive force of the first coil when supplied with electrical current from the first power supply, and
   wherein a series combination of the first coil and the third coil, a series combination of the fourth coil and the sixth coil, and a series combination of the second coil and the fifth coil are connected in parallel to the first power supply.

2. The charged particle beam deflector as set forth in claim 1,
   wherein said first coil, said second coil, said third coil, said fourth coil, said fifth coil, and said sixth coil are equal in number of turns,
   wherein electrical currents from the first power supply flowing through the first, third, fourth, and sixth coils, respectively, are equal to each other in magnitude, and
   wherein the electrical current from the first power supply flowing through the second coil is equal in magnitude to the electrical current flowing through the fifth coil and is twice the magnitude of the electrical current flowing through the first coil.

3. The charged particle beam deflector as set forth in claim 1, further comprising:
   a seventh coil wound with a width of 30 degrees around said core;
   an eighth coil wound with a width of 30 degrees around the core;
   a ninth coil wound with a width of 30 degrees around the core;
   a tenth coil wound with a width of 30 degrees around the core;
   an eleventh coil wound with a width of 30 degrees around the core;
   a twelfth coil wound with a width of 30 degrees around the core; and
   a second power supply electrically connected to the seventh coil, the eight coil, the ninth coil, the tenth coil, the eleventh coil, and the twelfth coil,
   wherein the first coil, the twelfth coil, the second coil, the seventh coil, the third coil, the eighth coil, the fourth coil, the ninth coil, the fifth coil, the tenth coil, the sixth coil, and the eleventh coil are ordered from first to twelfth to second to seventh to third to eighth to forth to ninth to fifth to tenth to sixth to eleventh, wherein angular intervals between the seventh and eighth coils, between the eighth and ninth coils, between the ninth and tenth coils, between the tenth and eleventh coils, between the eleventh and twelfth coils, and between the twelfth and seventh coils are equal to each other, wherein, wherein the seventh, eighth, and ninth coils are equal in direction of energization when supplied with electrical current from the second power supply, wherein the tenth, eleventh, and twelfth coils are equal in direction of energization when supplied with electrical current from the second power supply, wherein the seventh and tenth coils are opposite to each other in direction of energization when supplied with electrical current from the second power supply, wherein the seventh, ninth, tenth, and twelfth coils are equal in electromotive force when supplied with electrical current from the second power supply, wherein the eighth coil is equal in electromotive force to the eleventh coil and is twice the electromotive force of the seventh coil when supplied with electrical current from the second power supply, and wherein the first through twelfth coils do not overlap each other.

4. The charged particle beam deflector as set forth in claim 3, wherein said seventh coil, said eighth coil, said ninth coil, said tenth coil, said eleventh coil, and said twelfth coil are equal in number of turns, wherein electrical currents from the second power supply flowing through the seventh, ninth, tenth, and twelfth coils, respectively, are equal in magnitude, and wherein electrical current from the second power supply flowing through the eighth coil is equal in magnitude to electrical current flowing through the eleventh coil and is twice the magnitude of the electrical current flowing through the seventh coil.

5. The charged particle beam deflector as set forth in claim 1, further comprising:

a seventh coil wound with a width of 30 degrees around said core;

an eighth coil wound with a width of 30 degrees around the core;

a ninth coil wound with a width of 30 degrees around the core;

a tenth coil wound with a width of 30 degrees around the core;

an eleventh coil wound with a width of 30 degrees around the core;

a twelfth coil wound with a width of 30 degrees around the core; and a second power supply electrically connected to the seventh coil, the eighth coil, the ninth coil, the tenth coil, the eleventh coil, and the twelfth coil, wherein the first coil, the twelfth coil, the second coil, the seventh coil, the third coil, the eighth coil, the fourth coil, the ninth coil, the fifth coil, the tenth coil, the sixth coil, and the eleventh coil are ordered from first to twelfth to second to seventh to third to eighth to forth to ninth to fifth to tenth to sixth to eleventh, wherein angular intervals between the seventh and eighth coils, between the eighth and ninth coils, between the ninth and tenth coils, between the tenth and eleventh coils, between the eleventh and twelfth coils, and between the twelfth and seventh coils are equal to each other, wherein, wherein the seventh, eighth, and ninth coils are equal in direction of energization when supplied with electrical current from the second power supply, wherein the tenth, eleventh, and twelfth coils are equal in direction of energization when supplied with electrical current from the second power supply, wherein the seventh and tenth coils are opposite to each other in direction of energization when supplied with electrical current from the second power supply, wherein the seventh, ninth, tenth, and twelfth coils are equal in electromotive force when supplied with electrical current from the second power supply, wherein the eighth coil is equal in electromotive force to the eleventh coil and is twice the electromotive force of the seventh coil when supplied with electrical current from the second power supply, and wherein the first through twelfth coils do not overlap each other.

6. The charged particle beam deflector as set forth in claim 5, wherein said seventh coil, said ninth coil, said tenth coil, and said twelfth coil are equal in number of turns, wherein said eighth coil is equal in number of turns to said eleventh coil and is twice the number of turns of the seventh coil, and wherein electrical currents from the second power supply flowing through the seventh, eighth, ninth, tenth, eleventh, and twelfth coils, respectively, are equal in magnitude.

7. A charged particle beam system comprising at least one charged particle beam deflector as set forth claim 1.

8. A charged particle beam deflector comprising:

an annular core;

a first coil wound with a width of 30 degrees around the core;

a second coil wound with a width of 30 degrees around the core;

a third coil wound with a width of 30 degrees around the core;

a fourth coil wound with a width of 30 degrees around the core;

a fifth coil wound with a width of 30 degrees around the core;

a sixth coil wound with a width of 30 degrees around the core; and a first power supply electrically connected to the first coil, the second coil, the third coil, the fourth coil, the fifth coil and the sixth coil, wherein the first coil, the second coil, the third coil, the fourth coil, the fifth coil, and the sixth coil are arranged from first through sixth and at regular angular intervals such that the angular intervals between successive ones of the first through sixth coils including the interval between the sixth and first coils are equal to each other, wherein the first, second, and third coils are equal in direction of energization when supplied with electrical current from the first power supply, wherein the fourth, fifth, and sixth coils are equal in direction of energization when supplied with electrical current from the first power supply, wherein the first and fourth coils are mutually opposite in direction of energization when supplied with electrical current from the first power supply, wherein the first, third, fourth, and sixth coils are equal in electromotive force when supplied with electrical current from the first power supply, wherein the second and fifth coils are equal in electromotive force when supplied with electrical current from the first power supply, wherein the second coil is twice the electromotive force of the first coil when supplied with electrical current from the first power supply, and wherein a series combination of the first coil, second coil, and third coil and a series combination of the fourth coil, fifth coil, and sixth coil are connected in parallel with the power supply.

9. The charged particle beam deflector as set forth in claim 8, wherein said first coil, said third coil, said fourth coil, and said sixth coil are equal in number of turns, wherein said second coil is equal in number of turns to said fifth coil and is twice the number of turns of the first coil, and wherein electrical currents from the first power supply flowing through the first through sixth coils, respectively, are equal to each other in magnitude.

10. A charged particle beam system comprising at least one charged particle beam deflector as set forth claim 8.

* * * * *